United States Patent
Apalkov et al.

(10) Patent No.: US 9,608,039 B1
(45) Date of Patent: Mar. 28, 2017

(54) MAGNETIC JUNCTIONS PROGRAMMABLE USING SPIN-ORBIT INTERACTION TORQUE IN THE ABSENCE OF AN EXTERNAL MAGNETIC FIELD

(71) Applicant: Samsung Electronics Co., LTD., Gyeonggi-do (KR)

(72) Inventors: Dmytro Apalkov, San Jose, CA (US); Vladimir Nikitin, Campbell, CA (US)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 15/060,592

(22) Filed: Mar. 3, 2016

Related U.S. Application Data

(60) Provisional application No. 62/256,027, filed on Nov. 16, 2015.

(51) Int. Cl.
 *H01L 27/22* (2006.01)
 *G11C 11/16* (2006.01)
 *H01L 43/12* (2006.01)

(52) U.S. Cl.
 CPC .......... *H01L 27/228* (2013.01); *G11C 11/161* (2013.01); *G11C 11/1673* (2013.01); *G11C 11/1675* (2013.01); *H01L 43/12* (2013.01)

(58) Field of Classification Search
 None
 See application file for complete search history.

(56) References Cited

U.S. PATENT DOCUMENTS

| | | | |
|---|---|---|---|
| 9,076,537 B2 | 7/2015 | Khvalkovskiy | |
| 2014/0056061 A1* | 2/2014 | Khvalkovskiy | H01L 43/02 365/158 |

| | | | |
|---|---|---|---|
| 2015/0129995 A1 | 5/2015 | Wang | |

FOREIGN PATENT DOCUMENTS

| | | |
|---|---|---|
| CN | 104393169 | 3/2015 |
| WO | 2015039912 | 3/2015 |
| WO | 2015047194 | 4/2015 |

OTHER PUBLICATIONS

Manchon, A., "Interfacial spin-orbit splitting and current-driven spin torque in anisotropic tunnel junctions," Phys. Rev. B, vol. 83, No. 17, 172403, pp. 1-4; DOI:10.1103/PhysRevB.83.172403; May 1, 2011.
Luqiao Liu et al., "Spin-Torue Switching with the Giant Spin Hall Effect of Tantalum," DOI: 10.1126/science.1218197 Science 336, 555 (2012).

* cited by examiner

*Primary Examiner* — James G Norman
(74) *Attorney, Agent, or Firm* — Convergent Law Group LLP

(57) ABSTRACT

A magnetic memory including a plurality of magnetic junctions and at least one spin-orbit interaction (SO) active layer is described. Each of the magnetic junctions includes a reference layer, a free layer and a nonmagnetic spacer layer between reference and free layers. The magnetic junction includes a biasing structure for providing a magnetic bias in a first direction and/or the free layer has a length in the first direction and a width in a second direction. The width is less than the length. The SO active layer(s) are adjacent to the free layer and carry a current in a third direction. The third direction is at a nonzero acute angle from the first direction. The SO active layer(s) exerts a SO torque on the free layer due to the current passing through the at least one SO active layer. The free layer is switchable using the SO torque.

17 Claims, 5 Drawing Sheets

MAGNETIC JUNCTIONS PROGRAMMABLE USING SPIN-ORBIT INTERACTION TORQUE IN THE ABSENCE OF AN EXTERNAL MAGNETIC FIELD

CROSS-REFERENCE TO RELATED APPLICATIONS

This application claims the benefit of provisional Patent Application Ser. No. 62/256,027, filed Nov. 16, 2015, entitled USING IN-PLANE SO TORQUE AND ELONGATED SHAPE FOR SO PRECESSIONAL SWITCHING, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ includes a conventional pinned, or reference, layer, a conventional free layer and a conventional tunneling barrier layer between the conventional pinned and free layers. The conventional MTJ may include a conventional antiferromagnetic (AFM) layer. The conventional pinned layer and the conventional free layer are magnetic. The magnetization of the conventional pinned layer is fixed, or pinned, in a particular direction. The conventional free layer has a changeable magnetization. The pinned layer and free layer may have their magnetizations oriented perpendicular to the plane of the layers (perpendicular-to-plane) or in the plane of the layers (in-plane).

To switch the magnetic moment of the conventional free layer, a current is driven through the conventional MTJ in a current-perpendicular-to-plane (CPP) direction. This current is spin polarized by the pinned layer. When a sufficient current is driven through the conventional magnetic junction in a CPP configuration, the magnetic moment of the free layer may be switched to be parallel to or antiparallel to the pinned layer magnetic moment. The differences in magnetic configurations correspond to different magnetoresistances and thus different logical states (e.g. a logical "0" and a logical "1") of the conventional MTJ.

Although the conventional magnetic junction may be written using spin transfer and used in an STT-RAM, there are drawbacks. For example, very high currents may be required to achieve switching of the conventional free layer at a sufficiently low write error rate. These currents may require a larger selection transistor and/or may damage the conventional magnetic junction. Accordingly, what is needed is a method and system that may improve the performance of magnetic memories.

BRIEF SUMMARY OF THE INVENTION

A magnetic memory including a plurality of magnetic junctions and at least one spin-orbit interaction (SO) active layer is described. Each of the magnetic junctions includes a reference layer, a free layer and a nonmagnetic spacer layer between reference and free layers. The magnetic junction includes a biasing structure for providing a magnetic bias in a first direction and/or the free layer has a length in the first direction, a width in a second direction and an aspect ratio greater than one. The SO active layer(s) are adjacent to the free layer and have a line length in a third direction. The SO active layer carries a current along the line length in the third direction. The third direction is at a nonzero acute angle from the first direction. The SO active layer(s) exerts a SO torque on the free layer due to the current passing through the at least one SO active layer. The free layer is switchable using the SO torque.

DETAILED DESCRIPTION OF THE INVENTION

Figure 1:
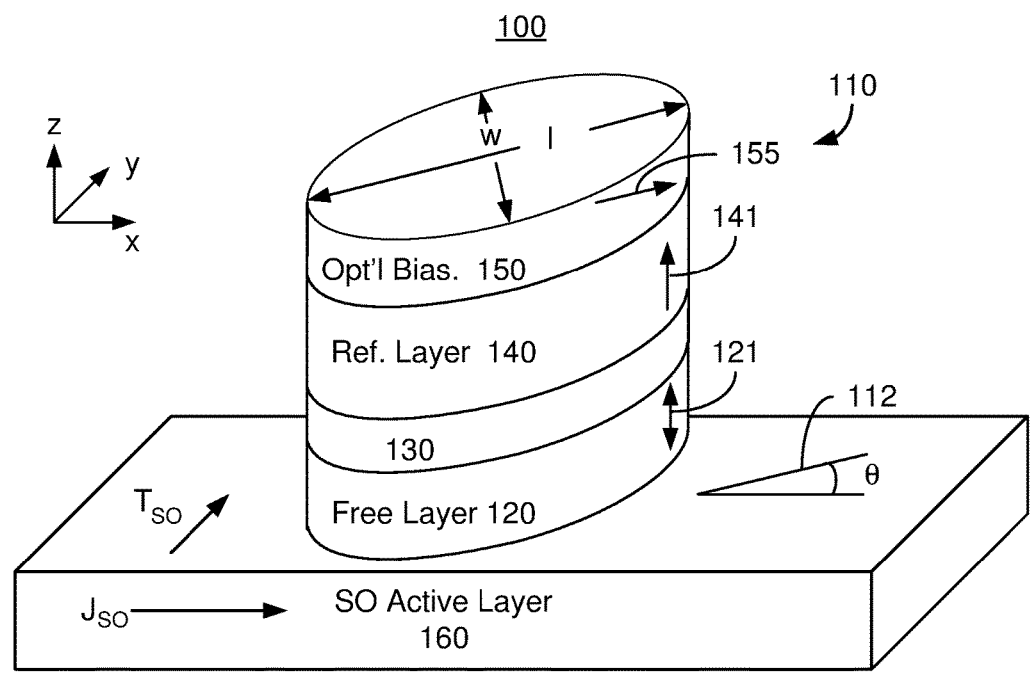
FIG. 1 depicts a perspective view of an exemplary embodiment of a magnetic memory including magnetic junctions programmable using SO torque in the absence of an external magnetic field.

The exemplary embodiments relate to magnetic junctions usable in magnetic devices, such as magnetic memories, and the devices using such magnetic junctions. The magnetic memories may include magnetic random access memories (MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, substeps and/or steps in different orders that are not inconsistent with the exemplary embodiments. Thus, the present invention is not intended to be limited to the embodiments shown, but is to be accorded the widest scope consistent with the principles and features described herein.

A magnetic memory including a plurality of magnetic junctions and at least one spin-orbit interaction (SO) active layer is described. Each of the magnetic junctions includes a reference layer, a free layer and a nonmagnetic spacer layer between reference and free layers. The magnetic junction includes a biasing structure for providing a magnetic bias in a first direction and/or the free layer has a length in the first direction, a width in a second direction and an aspect ratio greater than one. The SO active layer(s) are adjacent to the free layer and have a line length in a third direction. The SO active layer carries a current along the line length in the third direction. The third direction is at a nonzero acute angle from the first direction. The SO active layer(s) exerts a SO torque on the free layer due to the current passing through the at least one SO active layer. The free layer is switchable using the SO torque.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions having particular layers. However, one of ordinary skill in the art will readily recognize that magnetic junctions having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

As discussed above, in STT-RAM, a magnetic field need not be used to write to a magnetic junction. Instead, a write current is driven through the magnetic junction in a current perpendicular-to-plane (CPP) direction. To read data stored in the magnetic junction, a smaller read current is driven through magnetic junction in the CPP direction. However, the high write currents that may be required for low error rate writing may destroy a tunneling barrier layer in the magnetic junction. This may be undesirable.

Magnetic junctions that are programmable using spin-orbit interaction (SO) torque have also been developed. In SO torque-based memories, writing is performed using a current driven in-plane through a line having a high spin-orbit interaction. For example, the high spin-orbit interaction may be due to a bulk effect of the material itself (spin Hall effect), due to interfacial interactions (Rashba effect), some other effect or some combination thereof. The line is adjacent to the free layer of the magnetic junction. The in-plane current develops an SO torque, which can be used to switch the free layer magnetic moment.

For a free layer having a magnetization perpendicular to plane, two possibilities have been proposed. In one, the SO torque is used to assist STT switching. However, a write current is still driven through the magnetic tunneling junction in the CPP direction. In the other configuration, no STT torque is used. Thus, no write current is driven through the magnetic junction in the CPP direction. However, in order to reliably switch the magnetic moment using SO torque, an external magnetic field is applied. The individuals describing this switching have indicated that the external magnetic field is used to affect the initial state of the magnetic junction. In this explanation, the magnetic moment of the free layer may be reliably switched to the desired state based on changes to the initial state. This magnetic field may be modest, for example on the order of 50 Oe. In the absence of this external magnetic field, the switching is not sufficiently reliable for use in a magnetic memory. In general, for smaller magnetic junction sizes and higher areal density memories, the use of an external field is undesirable. Consequently, a mechanism for improving switching in a magnetic memory is still desired.

FIG. 1 depicts a perspective view of an exemplary embodiment of a magnetic memory 100 including magnetic junctions and programmable using SO torque in the absence of an external field and optionally in the absence of a current driven in the CPP direction through the magnetic junctions. For clarity, FIG. 1 is not to scale. In addition, portions of the magnetic memory 100 such as bit lines, row and column selectors, and selection devices such as transistors for each cell are not shown. The magnetic memory 100 includes a magnetic junction 110 and a spin-orbit interaction (SO)

active layer 160. The magnetic junction 110 may be part of a memory cell that may also include selection device(s) such as transistor(s) and/or other magnetic junctions. Typically, multiple magnetic junctions 100 and multiple memory cells are included in the magnetic memory 100. The magnetic memory 100 may be used in a variety of electronic devices.

The SO active layer 160 is a layer that has a strong spin-orbit interaction and that can be used in switching the magnetic moment 121 of the free layer 120. The SO active layer 160 may be used in generating a spin-orbit torque $T_{SO}$. More specifically, a write current is driven in-plane along the length of the SO active layer 160. The arrow $J_{SO}$ represents the current density for the write current driven through the SO active layer 160. Thus, the write current is driven through the SO active layer 160 in the +x or the −x direction. This write current gives rise to an attendant spin-orbit interaction may result in the spin-orbit torque $T_{SO}$. In the embodiment shown, the spin-orbit torque is along the y-axis. SO torque occurs for a current driven in-plane in the SO active layer 160 and a spin-orbit interaction. STT is due to a perpendicular-to-plane current flowing through the free layer 120, spacer layer 130 and reference layer 140, that injects spin polarized charge carriers into the free layer 120. In some embodiments, programming of the magnetic junction 110 is completed using SO torque alone. In other embodiments, another mechanism such as spin transfer may also be used in switching. The spin-orbit torque generated may thus be used in switching the magnetic moment of the free layer 120.

The magnetic junction 110 includes a free layer 120 having magnetic moment 121, a nonmagnetic spacer layer 130, a reference layer 140 having magnetic moment 141 and an optional bias structure 150. The magnetic junction 110 may also include optional polarization enhancement layer(s) (PEL(s)) having a high spin polarization. For example, a PEL might include Fe, CoFe and/or CoFeB. Bottom contact, top contact, optional seed layer(s) and optional capping layer(s) may be present but are not shown for simplicity. For example, the seed layer(s) may include a thin, crystalline MgO seed layer having a 200 orientation. Such an MgO layer may enhance the perpendicular magnetic anisotropy (PMA) of the adjacent layer. Similarly the capping layer(s) may include a thin, crystalline 200 MgO layer to enhance the PMA of the adjacent layer. In some embodiments, the SO active layer 160 is closer to the substrate (not shown) than the magnetic junction 110. In other embodiments, the magnetic junction 110 is closer to the substrate (not shown) than the SO active layer 120. Although not shown, a nonmagnetic layer may reside between the free layer 120 and the SO active layer 160 to moderate the interaction. However, in the embodiment shown, the free layer 120 adjoins (shares an interface with) the SO active layer 160.

An optional pinning layer (not shown) may be used to fix the magnetization (not shown) of the reference layer 140. The optional pinning layer may be an AFM layer or multilayer that pins the magnetization (not shown) of the reference layer 140 by an exchange-bias interaction. However, in other embodiments, the optional pinning layer may be omitted or another structure may be used.

The magnetic junction 100 is configured such that the free layer 120 is switchable between a plurality of stable magnetic states using a write current which is passed through the SO active layer 160 in the plane of the SO active layer. Thus, the free layer 120 is programmable using SO torque. The free layer 120 is also programmable in the absence of a write current driven through the magnetic junction 110 and in the absence of an external magnetic field. In alternate embodiments, however, a modest current driven through the magnetic junction 110 may also be used to assist in switching the free layer magnetic moment 121. In the embodiment shown, the perpendicular magnetic anisotropy energy of the free layer 120 exceeds the free layer out-of-plane demagnetization energy. Thus, the free layer magnetic moment 121 may be stable substantially perpendicular-to-plane.

The nonmagnetic spacer layer 130 is between reference layer 140 and the free layer 120. The nonmagnetic spacer layer 130 may be an MgO tunneling barrier layer. The MgO layer may be crystalline and have a 200 orientation for enhanced tunneling magnetoresistance (TMR). In other embodiments, the nonmagnetic spacer layer 130 may be a different tunneling barrier layer, may be a conductive layer or may have another structure.

The reference layer 140 is magnetic. The reference layer 140 may be a multilayer. The reference layer 140 may be a synthetic antiferromagnet including multiple ferromagnetic layers interleaved with and sandwiching nonmagnetic layer(s) such as Ru. Thus, the reference layer 140 may also include sublayers including but not limited to multiple ferromagnetic layers.

The PMA energy of the reference layer 140 exceeds its out-of-plane demagnetization energy in the embodiment shown. Because the reference layer 140 has a high PMA (PMA energy greater than out-of-plane demagnetization energy), the magnetic moment 141 of the reference layer 140 may be perpendicular-to-plane. Thus, the magnetic moment 141 may be along the positive z-direction as shown or antiparallel to the direction shown in FIG. 1. If the magnetic moment 141 is perpendicular-to-plane, a pinning layer is generally not used. For example, the reference layer 140 may include a multilayer including multiple repeats of a Co/Pt bilayer, a CoPt alloy, a CoTb alloy and/or multiple repeats of a Co/Tb bilayer. Such combinations may have a high PMA. Similarly, the reference layer 140 may include one or more of CoFeB, FeB, CoB, Fe, Co$_2$FeAl, Co$_2$FeAlSi, Co$_2$MnSi, MnGe and MnAl, which may have a high PMA. Note that as used herein CoFeB, FeB, CoB, MnGe and MnAl denote alloys in which the stoichiometry is not indicated. For example, CoFeB may include (CoFe)$_{1-x}$B$_x$, where x is greater than or equal to zero and less than or equal to 0.5 as-deposited. For example, x may be at least 0.2 and not more than 0.4. Similarly, FeB may be Fe$_{1-x}$B$_x$, where x is greater than or equal to zero and less than or equal to 0.5. Other materials and/or structures are having a high PMA possible for the reference layer 140. In other embodiments, the magnetic moment 141 of the reference layer 140 may be in-plane.

The free layer 120 is magnetic and has a PMA energy that exceeds the out-of-plane demagnetization energy when the magnetic junction 110 is in the quiescent state. In other words, the PMA energy is greater than the out-of-plane demagnetization energy when the free layer 120 is not being written. The magnetic moment 121 of the free layer 120 may be oriented perpendicular-to-plane as shown in FIG. 1 (in the +z or −z direction). The free layer 120 may be a multilayer, such as a SAF and/or other multilayer. In some embodiments, the free layer 120 may include materials analogous to those used in the reference layer 140. Further, the magnetic moment 121 of the free layer 120 is switched using the spin-orbit interaction effect, described below. In some embodiments, the free layer 120 magnetic moment 121 is switched using only the spin-orbit interaction effect.

The magnetic junction 110 is shown as elongated. Thus, the magnetic junction 110 is shown as having an elliptical footprint. The magnetic junction 110 may thus be an ellipse in the x-y plane. The magnetic junction 110 has a length, l, in one direction (in-plane) and a width, w, in another direction that is both in plane and perpendicular to the direction of l. The aspect ratio of the magnetic junction 110, AR, is given by l/w. In the embodiment shown, the aspect ratio of the magnetic junction 110 is greater than one. In some such embodiments, only the free layer 120 has the aspect ratio that exceeds one. In other such embodiments, at least the free layer 120 and the reference layer 140 have the aspect ratio greater than one. In other embodiments, the magnetic junction 110 may have an aspect ratio equal to one. For example, if the optional bias structure 150 (discussed below) is included, the magnetic junction 110 may have an aspect ratio equal to one. In such embodiments, the magnetic junction 110 may have a circular footprint.

The optional bias structure 150 provides a magnetic bias along a direction at the nonzero acute angle from the current direction. In some embodiments, therefore, the bias structure 150 includes a magnetic moment 155 that is fixed along the direction 112. For example, the bias structure 150 may include an AFM or other pinning layer having a magnetic orientation along the direction 112. The bias structure 150 also includes a ferromagnetic layer adjacent to the AFM layer and having its magnetic moment fixed in the direction 112 by the AFM layer. A nonmagnetic layer would also be included in the bias structure 150. Such a nonmagnetic layer would be between the ferromagnetic layer and the reference layer 140. Thus, the exchange interaction between the ferromagnetic layer and the reference layer 140 would be reduced or eliminated.

Thus, the magnetic junction 110 is shown with a long axis having length l and an optional bias structure 150. The length l is along the direction 112, at a nonzero acute angle (0°<θ<90°) with respect to the direction current is driven through the SO active layer 160 (direction of $J_{SO}$). The magnetic moment 155 of the optional bias structure 150 is along the direction 112 in the embodiment shown in FIG. 1. Thus, the magnetic bias due to the optional bias structure 150 may be at the nonzero acute angle from the current direction. In some embodiments, the acute angle θ is at least thirty degrees and not more than sixty degrees. In some embodiments, the angle θ is at least forty degrees and not more than fifty degrees. For example, θ may be nominally forty-five degrees. In other embodiments, the magnetic moment 155 of the optional bias structure 150 may not be aligned with the long axis of the ellipse. Thus the magnetic moment 155 may not be aligned with the direction 112. For example, the magnetic moment 155 might be aligned with the direction of the current $J_{SO}$. In other embodiments, the magnetic moment 155 may simply be canted from the direction 112. In still other embodiments, other directions of the magnetic moment 155 are possible.

At least one of the magnetic junction 110 includes the magnetic bias structure 150 and the aspect ratio of the free layer 120/magnetic junction 110 is greater than one and is aligned along a direction that is at the nonzero acute angle (0°<θ<90°) with respect to the direction current is driven through the SO active layer 160 (direction of $J_{SO}$). Stated differently, the bias structure 150 may be present in the magnetic junction 110; the long axis of length l of the magnetic junction 110 is at the nonzero acute angle with respect to the current direction and the aspect ratio exceeds one; or both. As a result, the free layer 120 is under the influence of an in-plane magnetic anisotropy along the direction 112. This in-plane magnetic anisotropy is in addition to a perpendicular anisotropy along z axis. This in-plane magnetic anisotropy may be due to the shape anisotropy of the magnetic junction 110/free layer 120, the magnetic bias from the bias structure 150 or both. The perpendicular anisotropy along z axis may be considerably higher than in-plane anisotropy. In some embodiments, the perpendicular magnetic anisotropy is at least three through five times higher than the in-plane magnetic anisotropy. Because the perpendicular magnetic anisotropy energy may be significantly higher than the in-plane magnetic anisotropy, the magnetic moment 121 of the free layer 120 may be stable perpendicular-to-plane as shown in FIG. 1.

In operation, the magnetic junction 110 may be read in a conventional manner. Thus, a read current insufficient to program the magnetic junction 110 may be driven through the magnetic junction 110 in the CPP direction. The resistance of the magnetic junction 110 is based on the orientation of the magnetic moments 121 and 141. Thus, data may be read from the magnetic junction 110 by determining the resistance of the magnetic junction 110.

In programming the magnetic junction 110, however, a write current corresponding to $J_{SO}$ is driven through the SO active layer 160 in-plane. This current generates an SO torque, which can switch the magnetic moment 121 of the free layer 120. Because of the magnetic anisotropy provided by the shape and/or bias structure 150 and along the direction 112, the magnetic moment 121 may be reliably switched to the desired state. In alternate embodiments, an external field and/or STT write current in the CPP direction may be used in addition to the SO torque. However, neither the external field nor the STT write current are required.

Figure 2A:
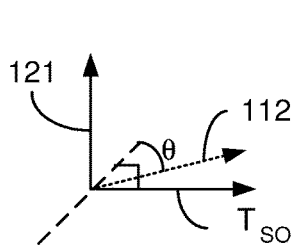
FIGS. 2A-2C depict exemplary embodiments the magnetic moment of a free layer before, during and after switching using SO torque.
Figure 2B:
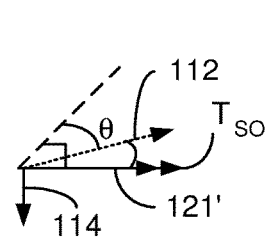
Figure 2C:
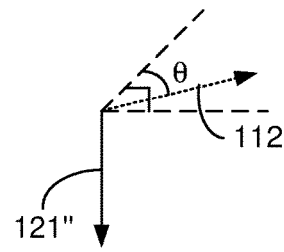

Switching of the magnetic moment 121 may be better understood with reference to FIGS. 2A-2C and 3A-3C. FIGS. 2A-2C depict exemplary embodiments of the magnetic moment 121 of the free layer before, during and after switching from the +z direction to the −z direction using SO torque. FIG. 2A depicts the magnetic moment 121 just after driving the write current in the SO active layer 160 begins. Also shown is the direction 112 of the magnetic anisotropy provided by the shape anisotropy and/or the magnetic bias 150. The free layer magnetic moment 121 starts off in the +z direction. The SO torque, $T_{SO}$, is generated by the current in the SO active layer. FIG. 2B depicts the magnetic moment 121' shortly thereafter. The magnetic moment 121' has been rapidly aligned with the SO torque, $T_{SO}$. However, the magnetic moment 121' is not aligned with the magnetic anisotropy 112 direction. Thus, the magnetic anisotropy provided by the shape and/or bias 150 in the direction 112 exerts a torque 114 on the magnetic moment 121' of the free layer 120. Although this torque 114 is small, once the SO torque is removed, the torque 114 may act on the moment 121'. Thus, once the write current through the SO active layer 160 is terminated, the torque 114 due to the magnetic anisotropy in the direction 112 causes the magnetic moment 121 to switch. This situation is shown in FIG. 2C. The magnetic moment 121" of the free layer 120 has switched to the desired direction. Thus, the torque due to the magnetic anisotropy selects the final state of the magnetic moment 121", rather than affecting the initial state. This is in contrast to the explanation above for the external magnetic field/SO torque switched magnetic junction.

Figure 3A:
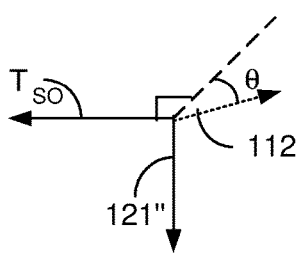
FIGS. 3A-3C depict exemplary embodiments the magnetic moment of a free layer before, during and after switching using SO torque.
Figure 3B:
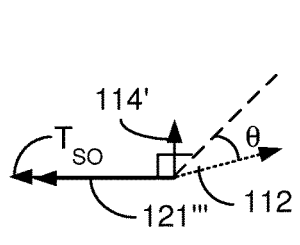
Figure 3C:
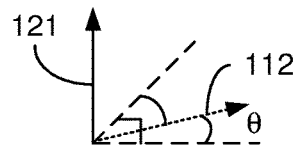

FIGS. 3A-3C depict exemplary embodiments of the magnetic moment 121" of the free layer before, during and after switching from the −z direction to the +z direction using SO torque. FIG. 3A depicts the magnetic moment 121" just after driving the write current in the SO active layer 160 begins. Also shown is the direction 112 of the magnetic anisotropy provided by the shape anisotropy and/or the magnetic bias 150. The free layer magnetic moment 121" starts off in the −z direction. The SO torque, $T_{SO}$, is generated by the current in the SO active layer. Because the magnetic moment 121'' is switched in the opposite direction, the write current is driven in the opposite direction to that shown in FIG. 1. FIG. 3B depicts the magnetic moment 121''' shortly thereafter. The magnetic moment 121''' has been rapidly aligned with the SO torque, $T_{SO}$. However, the magnetic moment 121''' is not aligned with the magnetic anisotropy 112 direction. Thus, the magnetic anisotropy provided by the shape and/or bias 150 in the direction 112 exerts a torque 114' on the magnetic moment 121''' of the free layer 120. Although this torque 114' is small, once the SO torque is removed, the torque 114' may act on the moment 121'''. Thus, once the write current through the SO active layer 160 is terminated, the torque 114' due to the magnetic anisotropy in the direction 112 causes the magnetic moment 121''' to switch. This situation is shown in FIG. 3C. The magnetic moment 121 of the free layer 120 has switched to the desired, +z direction. Thus, again, the torque due to the magnetic anisotropy selects the final state of the magnetic moment 121, rather than affecting the initial state. This is in contrast to the explanation above for the external magnetic field/SO torque switched magnetic junction.

Thus, the magnetic memory 100 may have improved performance. Because no STT write current is driven through the magnetic junction 110, damage to the magnetic junction 110 may be avoided. Because no external field is required, additional current carrying lines need not be included. The use of a long range magnetic field that may disturb neighboring magnetic junctions may also be avoided. Moreover, switching using SO torque may be fast. In some embodiments, switching may be accomplished in times on the order of two nanoseconds or less. Further, because STT switching is not used a higher read voltage and current may be used for the magnetic junction 110. For example, a higher damping, higher resistance area (RA) MgO layer may be used. Thus, performance of the magnetic memory 100 may be improved.

Figure 4:
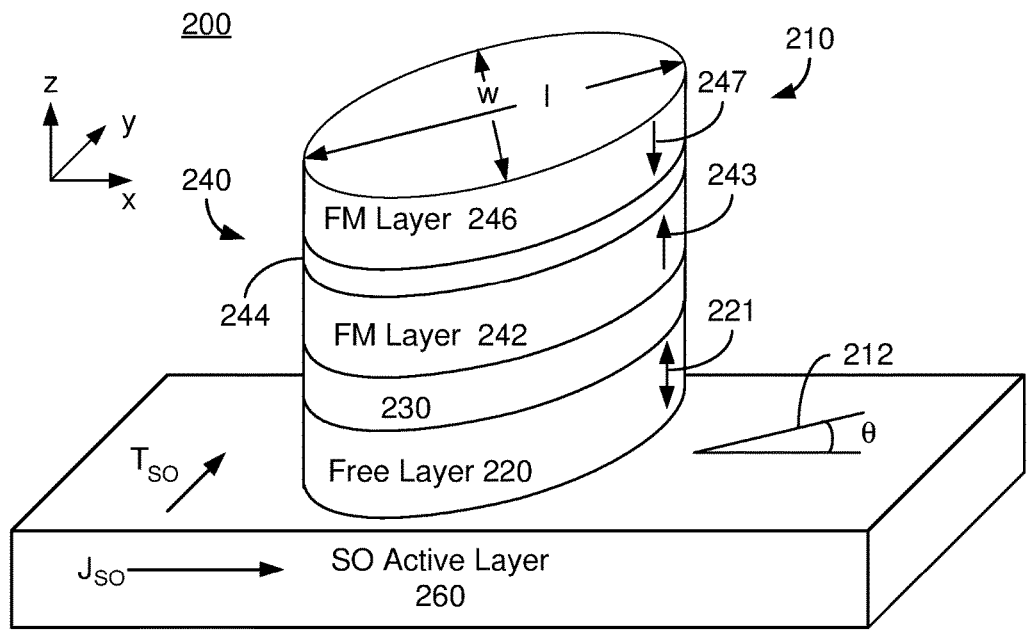
FIG. 4 depicts a perspective view of another exemplary embodiment of a magnetic memory including magnetic junctions programmable using SO torque in the absence of an external magnetic field.

FIG. 4 depicts a perspective view of another exemplary embodiment of a magnetic memory 200 including magnetic junctions 210 programmable using SO torque in the absence of an external magnetic field. For clarity, FIG. 4 is not to scale. The magnetic memory 200 may be used in a variety of electronic devices. The magnetic memory 200 is analogous to the magnetic memory 100. As a result, similar components have similar labels. The magnetic memory 200 includes an SO active layer 260 and a magnetic junction 210 including a free layer 220, a nonmagnetic spacer layer 230 and a reference layer 240 analogous to the SO active layer 160 and the magnetic junction 110 including the free layer 120, the nonmagnetic spacer layer 130 and the reference layer 140, respectively. Thus, the components 210, 220, 230, 240 and 260 may have similar structure, function and/or location to those of the components 110, 120, 130, 140 and 160, respectively. Although not shown, an underlying substrate, contacts, seed layers, PEL(s) and/or capping layers analogous to those described above may be present and are analogous to the substrate 101, bottom contact 102 and top contact 104 shown in FIG. 1 might be included. Finally, the direction 212 of the magnetic anisotropy and the angle θ are analogous to the direction 112 and angle θ, respectively, described above.

As can be seen in FIG. 4, the magnetic bias 150 has been omitted. Thus, the magnetic anisotropy in the direction 212 is provided by the shape anisotropy of the magnetic junction. Thus, the magnetic junction 210 has a length, l, a width, w, and an aspect ratio (l/w) greater than one such that a magnetic anisotropy along the direction 212 is provided. This direction is at a nonzero acute angle from the length of the SO active layer 260, along which current is driven. Stated differently, the magnetic shape anisotropy is at a nonzero acute angle from the direction of current. Although the entire magnetic junction 210 is shown as having the shape anisotropy, in other embodiments, some subset of the layers of the magnetic junction 210 including the free layer 220 may have the shape anisotropy.

In the embodiment shown, the reference layer 240 is a SAF including ferromagnetic layers 242 and 246 separated by a nonmagnetic spacer layer 244, such as Ru. In other embodiments, the reference layer 240 need not be a SAF. In the embodiment shown, the magnetic moments 243 and 247 of the ferromagnetic layers 242 and 244, respectively are antiparallel. Thus, the stray fields at the free layer 220 due to the reference layer 240 may be reduced. In other embodiments, the magnetic moments 243 and 247 may have another orientation including but not limited to being parallel. Similarly, the free layer 220 may be a single layer or a multilayer.

The magnetic memory 200 shares the benefits of the magnetic memory 100. Because no STT write current is driven through the magnetic junction 210, damage to the magnetic junction 210 may be avoided and a higher read voltage may be used. Because no external field is required, additional current carrying lines need not be included and disturbances to neighboring magnetic junctions may be avoided. Switching using SO torque may be fast, for example on the order of two nanoseconds or less. Thus, performance of the magnetic memory 200 may be improved.

Figure 5:
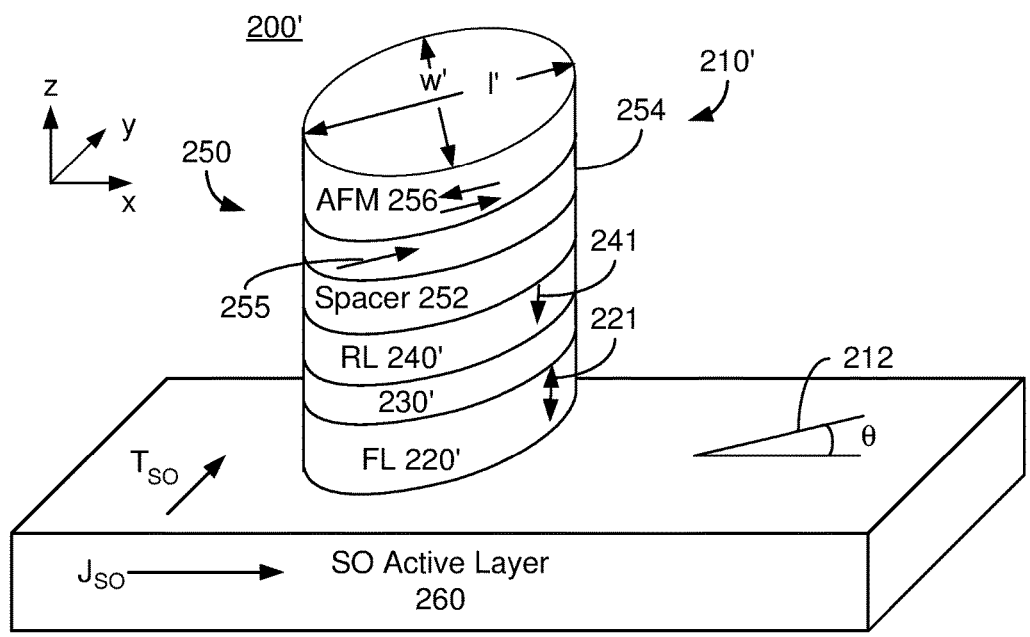
FIG. 5 depicts a perspective view of another exemplary embodiment of a magnetic memory including magnetic junctions programmable using SO torque in the absence of an external magnetic field.

FIG. 5 depicts a perspective view of another exemplary embodiment of a magnetic memory 200' including magnetic junctions 210' programmable using SO torque in the absence of an external magnetic field. For clarity, FIG. 5 is not to scale. The magnetic memory 200' may be used in a variety of electronic devices. The magnetic memory 200' is analogous to the magnetic memory 100 and/or 200. As a result, similar components have similar labels. The magnetic memory 200' includes an SO active layer 260 and a magnetic junction 210' including a free layer 220', a nonmagnetic spacer layer 230', a reference layer 240' and a magnetic bias structure 250 analogous to the SO active layer 160/260 and the magnetic junction 110/210 including the free layer 120/220, the nonmagnetic spacer layer 130/230, the reference layer 140/240 and the magnetic bias structure 150, respectively. Thus, the components 210', 220', 230', 240', 250 and 260 may have similar structure, function and/or location to those of the components 110/210, 120/220, 130/230, 140/240, 150 and 160/260, respectively. Although not shown, an underlying substrate, contacts, seed layers, PEL(s) and/or capping layers analogous to those described above may be present and are analogous to the substrate 101, bottom contact 102 and top contact 104 shown in FIG. 1 might be included. Finally, the direction 212 of the magnetic anisotropy and the angle θ are analogous to the direction 112 and angle θ, respectively, described above.

As can be seen in FIG. 5, the bias structure 250 is present. Thus, the magnetic field in the direction 212 is provided at least by the bias structure 250. In some embodiments, there is also a shape anisotropy such that l'/w' is greater than one. However, in other embodiments, the aspect ratio is one. The magnetic bias structure 250 includes an AFM pinning layer 256, a ferromagnetic layer 254 and a spacer layer 252 that is nonmagnetic. The AFM pinning layer 256 pins the magnetic moment 255 of the ferromagnetic layer 254 in the direction 212. The direction the AFM 256 pins the magnetic moment 255 may be set by annealing the magnetic junction 210' (and thus AFM 256) in a magnetic field in the desired direction 212. This direction 212 is at a nonzero acute angle from the length of the SO active layer 260, along which current is driven. Stated differently, the magnetic anisotropy due to the bias structure 250 is at a nonzero acute angle from the direction of current. In the embodiment shown, the reference layer 240' is depicted as a single layer. However, the reference layer 240' may be a multilayer including but not limited to a SAF. Similarly, the free layer 220' may be a single layer or a multilayer.

The magnetic memory 200' shares the benefits of the magnetic memory 100 and/or 200. Because no STT write current is driven through the magnetic junction 210', damage to the magnetic junction 210' may be avoided and a higher read voltage may be used. Because no external field is required, additional current carrying lines need not be included and disturbances to neighboring magnetic junctions may be avoided. Switching using SO torque may be fast, for example on the order of two nanoseconds or less. Thus, performance of the magnetic memory 200' may be improved.

Figure 6:
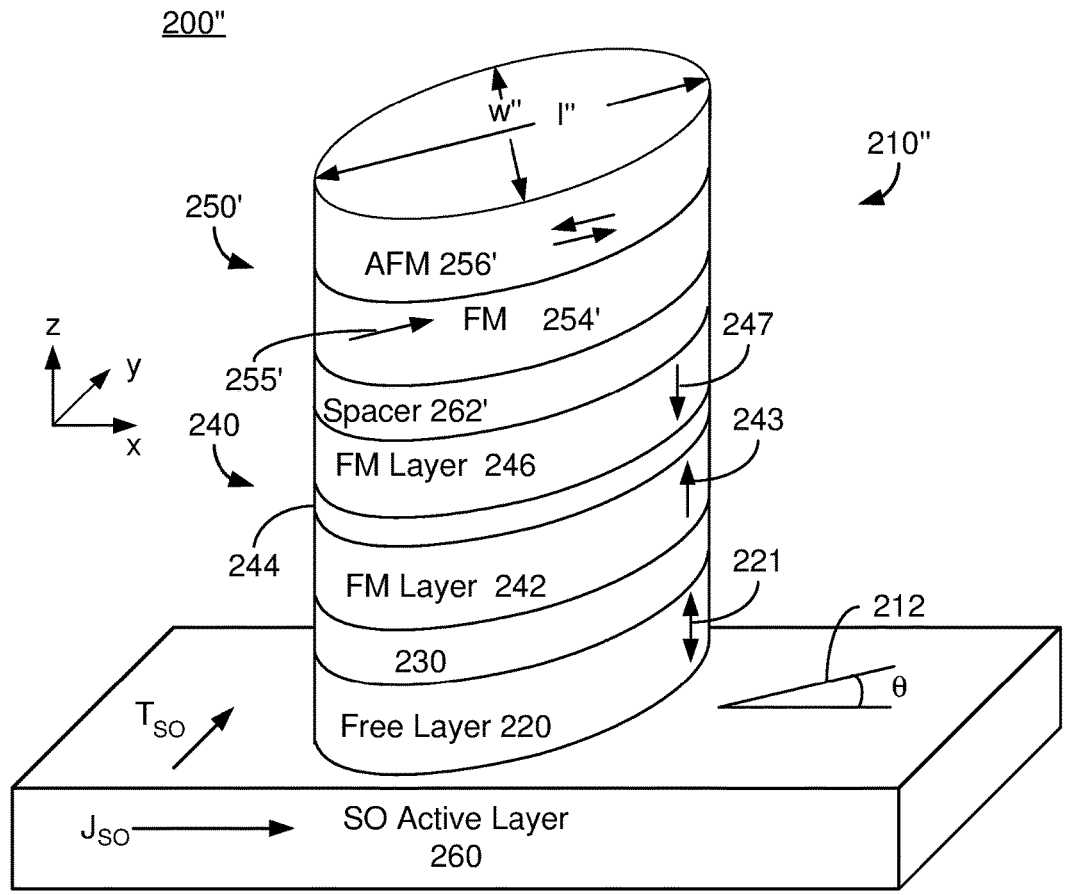
FIG. 6 depicts a perspective view of another exemplary embodiment of a magnetic memory including magnetic junctions programmable using SO torque in the absence of an external magnetic field.

FIG. 6 depicts a perspective view of another exemplary embodiment of a magnetic memory 200" including magnetic junctions 210" programmable using SO torque in the absence of an external magnetic field. For clarity, FIG. 6 is not to scale. The magnetic memory 200" may be used in a variety of electronic devices. The magnetic memory 200" is analogous to the magnetic memory 100, 200 and/or 200'. As a result, similar components have similar labels. The magnetic memory 200" includes an SO active layer 260 and a magnetic junction 210" including a free layer 220, a nonmagnetic spacer layer 230, a reference layer 240 and a magnetic bias structure 250' analogous to the SO active layer 160/260 and the magnetic junction 110/210/210' including the free layer 120/220/220', the nonmagnetic spacer layer 130/230/230', the reference layer 140/240/240' and the magnetic bias structure 150/250, respectively. Thus, the components 210, 220, 23, 240, 250' and 260 may have similar structure, function and/or location to those of the components 110/210/210', 120/220/220', 130/230/230', 140/240/240', 150/250 and 160/260, respectively. Although not shown, an underlying substrate, contacts, seed layers, PEL(s) and/or capping layers analogous to those described above may be present and are analogous to the substrate 101, bottom contact 102 and top contact 104 shown in FIG. 1 might be included. Finally, the direction 212 of the magnetic anisotropy and the angle θ are analogous to the direction 112 and angle θ, respectively, described above.

As can be seen in FIG. 6, the magnetic junction 210" both includes the magnetic bias structure 250' and is elongated. Thus, the magnetic field in the direction 212 is provided by the bias structure 250' and by the shape anisotropy of at least the free layer 220. The magnetic bias structure 250' includes an AFM pinning layer 256', ferromagnetic layer 254' having magnetic moment 255' and nonmagnetic spacer layer 262' that are analogous to the AFM pinning layer 256, ferromagnetic layer 254 having magnetic moment 255 and nonmagnetic spacer layer 252, respectively. In addition, thus, the magnetic junction 210" has a length, l", a width, w", and an aspect ratio (l"/w") greater than one that are analogous to the length, l, the width, w, and the aspect ratio l/w, respectively. Thus, at least the free layer 220" has a shape anisotropy in the direction 212. Although the entire magnetic junction 210" is shown as having the shape anisotropy, in other embodiments, some subset of the layers of the magnetic junction 210" including the free layer 220" may have the shape anisotropy. Thus, the magnetic field is due to both the bias structure 250 and the shape anisotropy. This magnetic field is at a nonzero acute angle from the direction of current.

In the embodiment shown, the reference layer 240 is a SAF including ferromagnetic layers 242 and 246 separated by a nonmagnetic spacer layer 244 and is analogous to the reference layer 240 including layers 242, 246 and 244, respectively. In other embodiments, the reference layer 240 need not be a SAF. In the embodiment shown, the magnetic moments 243 and 247 of the ferromagnetic layers 242 and 246, respectively are antiparallel. Thus, the stray fields at the free layer 220 due to the reference layer 240 may be reduced. In other embodiments, the magnetic moments 243 and 247 may have another orientation including but not limited to being parallel. Similarly, the free layer 220 may be a single layer or a multilayer.

The magnetic memory 200" shares the benefits of the magnetic memory 100, 200 and/or 200'. Because no STT write current is driven through the magnetic junction 210", damage to the magnetic junction 210" may be avoided and a higher read voltage may be used. Because no external field is required, additional current carrying lines need not be included and disturbances to neighboring magnetic junctions may be avoided. Switching using SO torque may be fast, for example on the order of two nanoseconds or less. Thus, performance of the magnetic memory 200" may be improved.

Figure 7:
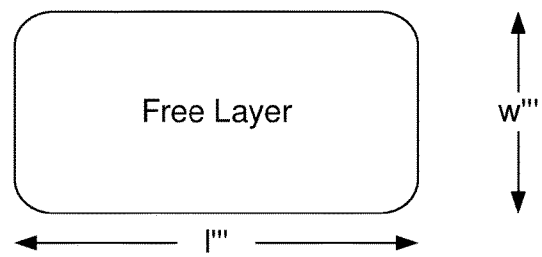
FIG. 7 depicts a plan view of an exemplary embodiment of a magnetic device including magnetic junctions programmable using SO torque in the absence of an external magnetic field.

FIG. 7 depicts a plan view of an exemplary embodiment of a magnetic junction 210''' programmable using SO torque in the absence of an external magnetic field. For clarity, FIG. 7 is not to scale. The magnetic junction 210''' may be used in a variety of electronic devices. The magnetic junction 210''' is analogous to the magnetic junction 110, 210, 210' and/or 210". As a result, similar components have similar labels.

The free layer 220''' is elongated at a nonzero acute angle from the direction in which current is driven, as described above. The free layer 220 has an aspect ratio greater than one. The remaining layers (not shown) may be analogous to those depicted for the magnetic junction 110, 210, 210' and/or 210". A magnetic bias structure analogous to the bias structure 150, 250 and/or 250' may or may not be included. However, in the embodiment shown, the footprint of the free layer 220''' in the x-y plane is not elliptical. In the embodiment shown, the free layer 220''' has a footprint that is generally rectangular in shape. The remaining layers of the magnetic junction 210''' may have the same or different aspect ratio and shape. In other embodiments, the footprint of the free layer 220''' may have a different shape. However, the aspect ratio and magnetic bias described above are desired to be maintained.

The magnetic junction 210''' shares the benefits of the magnetic junction 110, 210, 210' and/or 210". Because no STT write current is driven through the magnetic junction 210''', damage to the magnetic junction 210''' may be avoided and a higher read voltage may be used. Because no external field is required, additional current carrying lines need not be included and disturbances to neighboring magnetic junctions may be avoided. Switching using SO torque may be fast, for example on the order of two nanoseconds or less. Thus, performance of the magnetic junction 210" may be improved.

Figure 8:
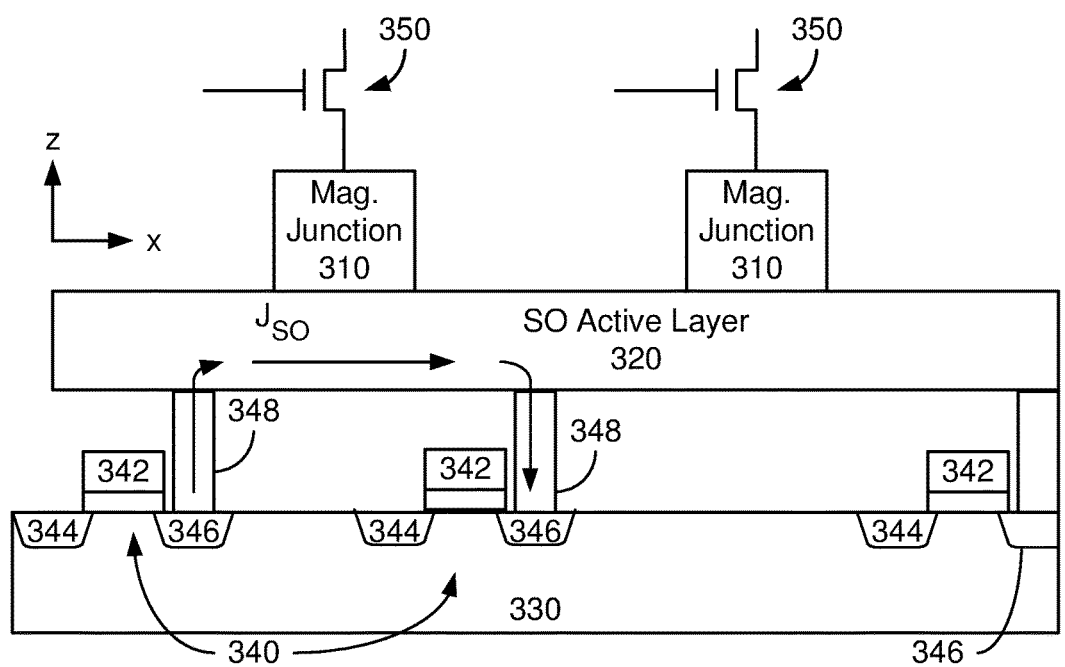
FIG. 8 depicts a side view of another exemplary embodiment of a magnetic memory including magnetic junctions programmable using SO torque in the absence of an external magnetic field.

FIG. 8 depicts a perspective view of another exemplary embodiment of a magnetic memory 300 including magnetic junctions 310 programmable using SO torque in the absence of an external magnetic field. For clarity, FIG. 8 is not to scale. The magnetic memory 300 may be used in a variety of electronic devices. The magnetic memory 300 is analogous to the magnetic memory 100, 200, 200' and/or 200" and/or magnetic junction 210'". The magnetic memory 300 includes an SO active layer 320 and a magnetic junctions 310 analogous to the SO active layer 160/260 and the magnetic junction 110/210/210'/210"/210'", respectively. Thus, the components 310 and 320 may have similar structure, function and/or location to those of the components 110/210/210'/210"/210'" and 160/260, respectively. Although not shown, an underlying substrate, contacts, seed layers, PEL(s) and/or capping layers analogous to those described above may be present and are analogous to the substrate 101, bottom contact 102 and top contact 104 shown in FIG. 1 might be included.

FIG. 8 also depicts underlying layer 330 in which transistors 340 have been formed. Each transistor 340 includes a gate 342, a source 344 and a drain 326. Also shown are optional additional selection devices 350 and conductive vias 348. In other embodiments, additional selection devices 350 may be omitted and selection may be made via transistors 340.

As can be seen in FIG. 8, the transistors 340 are connected between the magnetic junctions 310. Thus, current may be driven through the SO active layer adjacent to only the magnetic junction(s) desired to be programmed. The current is shown as being driven in the +x direction. However, current may also be driven in the −x direction to program the magnetic junction 310 to the opposite state.

The magnetic memory 300 shares the benefits of the magnetic memory 100, 200, 210' and/or 200" and/or magnetic junction 210'". Because no STT write current is driven through the magnetic junction 310, damage to the magnetic junction 310 may be avoided and a higher read voltage may be used. Because no external field is required, additional current carrying lines need not be included and disturbances to neighboring magnetic junctions may be avoided. Switching using SO torque may be fast, for example on the order of two nanoseconds or less. Thus, performance of the magnetic memory 300 may be improved.

Figure 9:
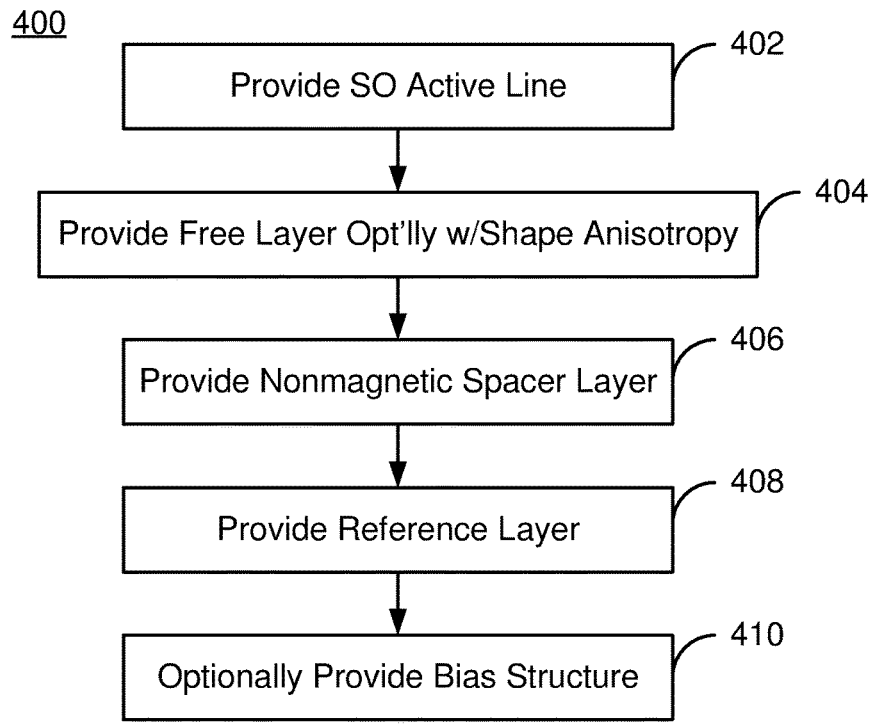
FIG. 9 is a flow chart depicting an exemplary embodiment of a method for providing a magnetic memory programmable using SO torque in the absence of an external magnetic field.

FIG. 9 depicts an exemplary embodiment of a method 400 for fabricating a magnetic memory programmable using SO torque and usable in a variety of electronic devices. For simplicity, some steps may be omitted, performed in another order, include substeps and/or combined. Further, the method 400 may start after other steps in forming a magnetic memory have been performed. For simplicity, the method 400 is described in the context of the magnetic memory 100. However, other magnetic memories, including but not limited to the magnetic memories 200, 200', 200" and/or 300 and/or the magnetic junction 210'" may be formed.

The SO active layer 160 is provided, via step 402. Step 402 may include depositing and patterning the desired materials for the SO active layer 160. Steps 404, 406, 408 and 410 may then be used to provide the magnetic junctions 110.

A free layer 120 is provided, via step 404. The free layer 120 may have an aspect ratio of greater than one and a shape anisotropy in the direction 112, at a nonzero angle from the direction along which current is driven in the SO active layer 160. In some embodiments, the free layer 120 adjoins the SO active layer 160. The PMA for the free layer 120 exceeds its out-of-plane demagnetization energy.

A nonmagnetic spacer layer 130 is provided, via step 406. Step 406 may include depositing MgO, which forms a tunneling barrier layer. In some embodiments, step 406 may include depositing MgO using, for example, radio frequency (RF) sputtering. In other embodiments, metallic Mg may be deposited, then oxidized in step 406. The nonmagnetic spacer layer 130 may also shapes in an analogous manner to the free layer 120.

A reference layer 140 that may have its PMA exceeding its out-of-plane demagnetization energy is provided via step 408. In some embodiments, step 408 may include providing a multilayer such as a SAF, a high PMA multilayer, and/or another multilayer.

The bias structure 150 may optionally be provided, via step 410. Thus, the free layer 120 is formed with the shape anisotropy in step 404 and/or the bias structure 150 is formed in step 410. Thus, the magnetic junctions 110 being formed have a magnetic anisotropy at the desired angle from the direction along which current is driven. Thus, the magnetic memories 100, 200, 200', 200" and/or 300 and/or the magnetic junction 210'" may be formed as a result, the benefits of the magnetic memories 100, 200, 200', 200" and/or 300 and/or the magnetic junction 210'" may be achieved.

Figure 10:
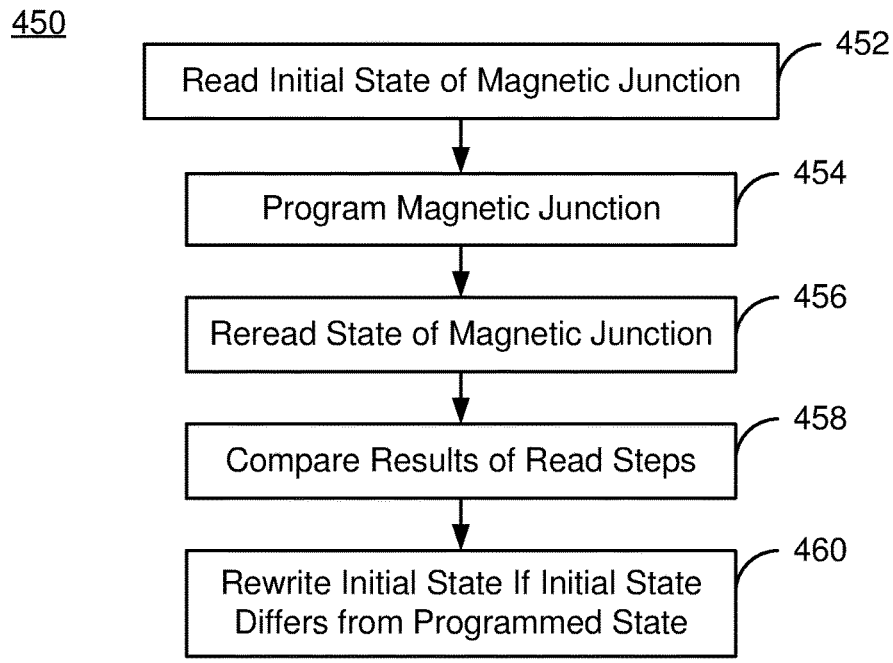
FIG. 10 is a flow chart depicting an exemplary embodiment of a method for reading a magnetic memory programmable using SO torque in the absence of an external magnetic field.

FIG. 10 is a flow chart depicting an exemplary embodiment of an alternative method 450 for reading a magnetic memory programmable using SO torque in the absence of an external magnetic field. For simplicity, some steps may be omitted, performed in another order, include substeps and/or combined. For simplicity, the method 450 is described in the context of the magnetic memory 100. However, the method 450 may be used with other magnetic memories, including but not limited to the magnetic memories 200, 200', 200" and/or 300 and/or the magnetic junction 210'".

The magnetic junction 110 is read, via step 452. Thus, a read current is driven through magnetic junction 110 and the resistance of the magnetic junction 110 determined.

A particular state is then programmed into the magnetic junction 110, via step 454. Step 454 include driving a current through the SO active layer 160 in the appropriate direction for the desired state. For the purposes of explanation, suppose a logical "0" is written in step 454.

The magnetic junction 110 is then read again, via step 456. Thus, a read current is driven through magnetic junction 110 and the resistance of the magnetic junction 110 determined.

Via step 458, the state determined in step 452 is compared to the state read in step 456. If the state has changed, then the original state was a logical "1". Consequently, the original state is rewritten to preserve the stored data, via step 460. If the state has not changed, then the initial state was a logical "0". Thus, the state of the magnetic junction 110 has been determined and maintained.

A method and system for providing and using a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic memory comprising:
a plurality of magnetic junctions, each of the plurality of magnetic junctions including a reference layer, a nonmagnetic spacer layer and a free layer, the nonmagnetic spacer layer residing between reference layer and the free layer, at least one of the magnetic junction including a biasing structure for providing a magnetic bias in a first direction and the free layer having a length in the first direction, a width in a second direction and an aspect ratio, the aspect ratio being the length divided by the width, the aspect ratio being greater than one; and at least one spin-orbit interaction (SO) active layer adjacent to the free layer of the each of the plurality of magnetic junctions, the SO active layer having a line length in a third direction, the at least one SO active layer carries a current along the line length in the third direction, the third direction being at a nonzero acute angle from the first direction, the at least one SO active layer exerting a SO torque on the free layer due to the current passing through the at least one SO active layer;

wherein the free layer is switchable using the SO torque.

2. The magnetic memory of claim 1 wherein the third direction is substantially perpendicular to a fourth direction between the SO active layer and the free layer.

3. The magnetic memory of claim 1 wherein the nonzero acute angle is at least thirty degrees and not more than sixty degrees.

4. The magnetic memory of claim 2 wherein the nonzero acute angle is at least forty degrees and not more than fifty degrees.

5. The magnetic memory of claim 1 wherein the free layer has the length in the first direction and the width in the second direction.

6. The magnetic memory of claim 5 wherein the free layer has a free layer out-of-plane demagnetization energy and a free layer perpendicular magnetic anisotropy energy greater than the free layer out-of-plane demagnetization energy.

7. The magnetic memory of claim 5 wherein the free layer has an elliptical footprint.

8. The magnetic memory of claim 1 wherein the reference layer has the length in the first direction and the width in the second direction.

9. The magnetic memory of claim 1 wherein the reference layer is a synthetic antiferromagnet including a plurality of ferromagnetic layers interleaved with at least one nonmagnetic layer.

10. The magnetic memory of claim 1 wherein the magnetic junction includes the biasing structure.

11. The magnetic memory of claim 10 wherein the biasing structure includes:
a pinning layer;
a ferromagnetic layer adjacent to the pinning layer and having a magnetic moment in the first direction, the magnetic moment being biased in the first direction by the pinning layer; and
a spacer layer, the ferromagnetic layer being between the pinning layer and the spacer layer, the spacer layer being nonmagnetic and residing between the ferromagnetic layer and the reference layer.

12. The magnetic memory of claim 10 wherein the free layer has the length in the first direction, the width in the second direction and the aspect ratio.

13. The magnetic memory of claim 10 wherein the free layer has a free layer out-of-plane demagnetization energy and a free layer perpendicular magnetic anisotropy energy greater than the free layer out-of-plane demagnetization energy.

14. The magnetic memory of claim 10 wherein the reference layer is a synthetic antiferromagnet including a plurality of ferromagnetic layers interleaved with at least one nonmagnetic layer.

15. The magnetic memory of claim 1 further comprising:
a plurality of transistors connected with the at least one SO line such that the current can be driven through a portion of the at least one SO line adjacent to a selected magnetic junction of the plurality of magnetic junctions.

16. A method for providing a memory comprising:
providing a plurality of magnetic junctions, each of the plurality of magnetic junctions including a reference layer, a nonmagnetic spacer layer and a free layer, the nonmagnetic spacer layer residing between reference layer and the free layer, at least one of the magnetic junction including a biasing structure for providing a magnetic bias in a first direction and the free layer having a length in the first direction, a width in a second direction and an aspect ratio, the aspect ratio being the length divided by the width, the aspect ratio being greater than one; and
providing at least one spin-orbit interaction (SO) active layer adjacent to the free layer of the each of the plurality of magnetic junctions, the SO active layer having a line length in a third direction, the at least one SO active layer carrying a current along the line length in the third direction, the third direction being at a nonzero acute angle from the first direction, the at least one SO active layer exerts a SO torque on the free layer due to the current passing through the at least one SO active layer;
wherein the free layer is switchable using the SO torque.

17. A method for reading a magnetic memory including a plurality of magnetic junctions and at least one spin-orbit interaction (SO) active layer, the method comprising:
reading an initial state of a magnetic junction of the plurality of magnetic junctions in the magnetic memory, each of the plurality of magnetic junctions including a reference layer, a nonmagnetic spacer layer and a free layer, the nonmagnetic spacer layer residing between reference layer and the free layer, at least one of the magnetic junction including a biasing structure for providing a magnetic bias in a first direction and the free layer having a length in the first direction, a width in a second direction and an aspect ratio, the aspect ratio being the length divided by the width, the aspect ratio being greater than one, the at least one SO active layer adjacent to the free layer of the each of the plurality of magnetic junctions, the SO active layer having a line length in a third direction, the at least one SO active layer carries a current along the line length in the third direction, the third direction being at a nonzero acute angle from the first direction, the at least one SO active layer exerting a SO torque on the free layer due to the current passing through the at least one SO active layer, the free layer being switchable using the SO torque;
writing a predetermined state to the magnetic junction;
rereading the magnetic junction after the step of writing the predetermined step;
comparing the initial state and the predetermined state; and
programming the magnetic junction to the initial state if the predetermined state differs from the initial state.

* * * * *